(12) United States Patent
Yamamoto et al.

(10) Patent No.: US 6,307,253 B1
(45) Date of Patent: Oct. 23, 2001

(54) LEAD FRAME AND SEMICONDUCTOR DEVICE MADE BY USING IT

(75) Inventors: Masao Yamamoto; Hiroshi Imai, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/180,404

(22) PCT Filed: Mar. 26, 1998

(86) PCT No.: PCT/JP98/01386

§ 371 Date: Nov. 9, 1998

§ 102(e) Date: Nov. 9, 1998

(87) PCT Pub. No.: WO98/44555

PCT Pub. Date: Oct. 8, 1998

(30) Foreign Application Priority Data

Mar. 28, 1997 (JP) .................................... 9-076965
Mar. 28, 1997 (JP) .................................... 9-076966
Mar. 28, 1997 (JP) .................................... 9-076967
Mar. 28, 1997 (JP) .................................... 9-076968

(51) Int. Cl.$^7$ .......................... H01L 23/495; H01L 23/48; H01L 21/50
(52) U.S. Cl. .......................... 257/666; 257/696; 257/698; 257/673; 257/775; 257/797; 257/670; 257/672; 257/692; 257/690; 29/827
(58) Field of Search ..................... 257/666, 669, 257/674, 676, 690, 692, 696, 698, 735, 775, 797; 29/827

(56) References Cited

U.S. PATENT DOCUMENTS 5,038,453     8/1991  Kurita et al. ...................... 29/827
5,792,676  *  8/1998  Masumoto et al. ................ 438/111
5,821,611  * 10/1998  Kubota et al. .................... 257/673
6,005,287  * 12/1999  Kaiya et al. ...................... 257/674
6,043,430  *  3/2000  Chun ................................ 257/672
6,075,286  *  6/2000  Ewer ................................. 257/692
6,080,602  *  6/2000  Tani et al. ........................ 438/114
6,080,999  *  6/2000  Mizunchi ......................... 257/666
6,084,294  *  7/2000  Tomita ............................. 257/666
6,084,310  *  7/2000  Mizuno et al. .................. 257/692
6,107,676  *  8/2000  Suzuki ............................. 257/666
6,107,677  *  8/2000  Schoenfeld et al. ............ 257/666

FOREIGN PATENT DOCUMENTS 63-187657   8/1988   (JP) .
2-284436   11/1990   (JP) .
6-36422    5/1994   (JP) .
6-71015    9/1994   (JP) .

* cited by examiner

Primary Examiner—Alexander O. Williams
(74) Attorney, Agent, or Firm—Merchant & Gould P.C.

(57) ABSTRACT

A lead frame (1) is provided which includes elongated side frames (2, 3) extending in parallel to each other, and section bars (4) connecting the side frames in a manner allowing the side frames to be shifted longitudinally. The side frame (2) is integrally formed with first lead terminals (6), whereas the side frame (3) is integrally formed with second lead terminals (7). Extremities of the first and the second lead terminals are overlapped after the side frames (2, 3) are shifted. At least either one of the first lead terminal (6) and the second lead terminal (7) is formed with a weaker portion having reduced bending strength. The extremities of the first and the second lead terminals is bonded to a semiconductor element (T) after the side frames (2, 3) are shifted. Thereafter, restoring force due to the spring-back action of the section bars (4) acts on the lead terminals (6, 7) and the semiconductor element (T). However, the restoring force is used to deform the weaker portion.

5 Claims, 6 Drawing Sheets

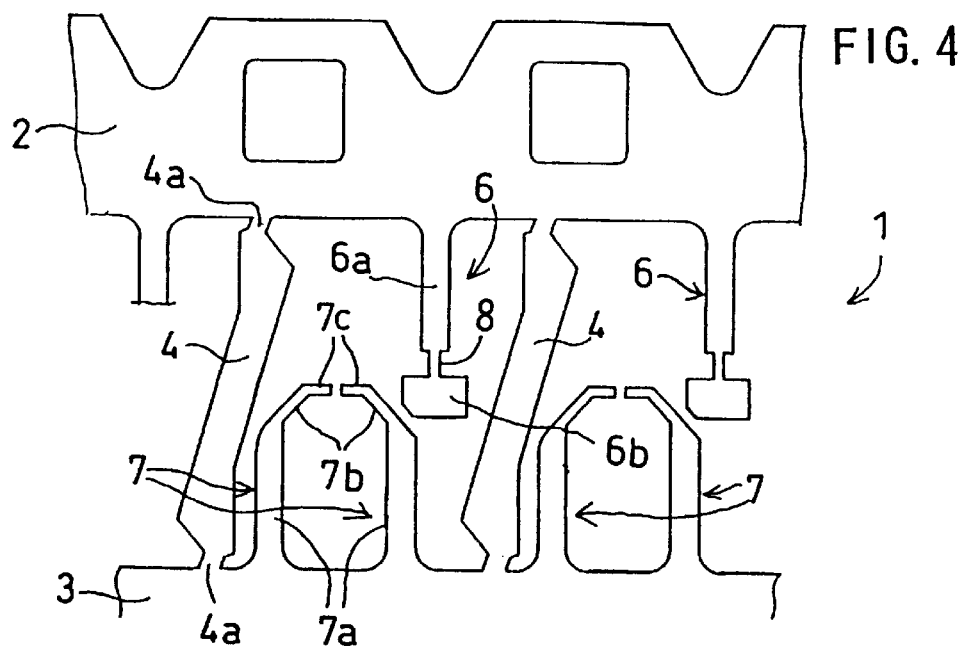
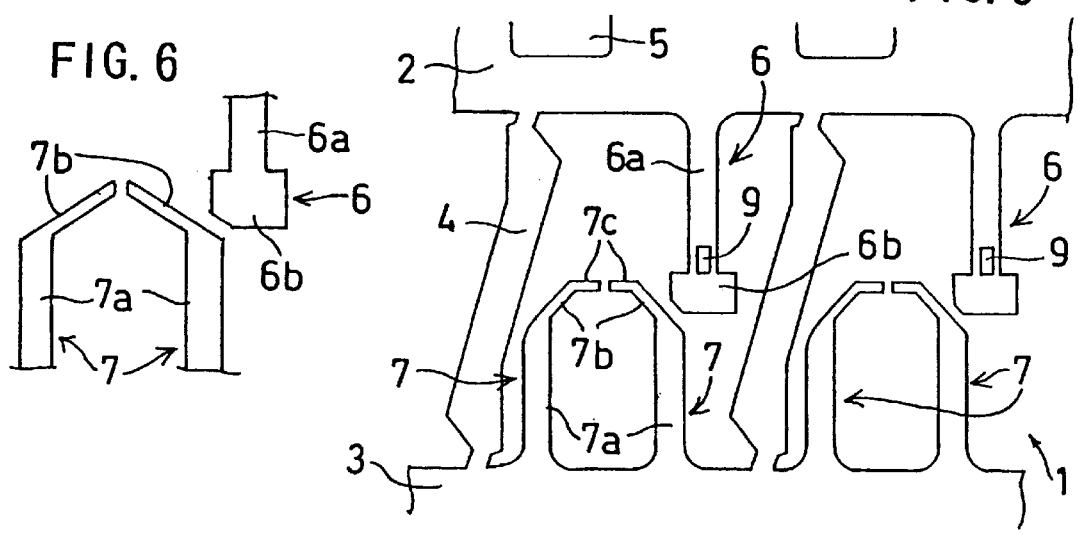
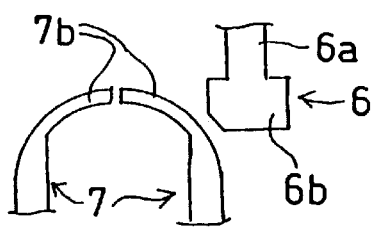
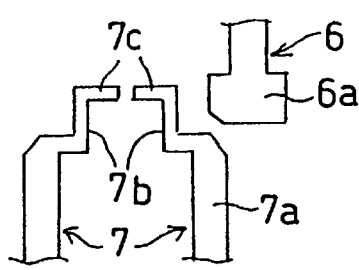
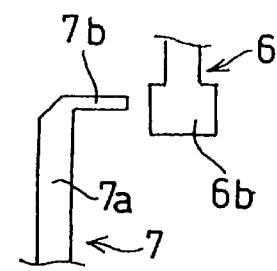

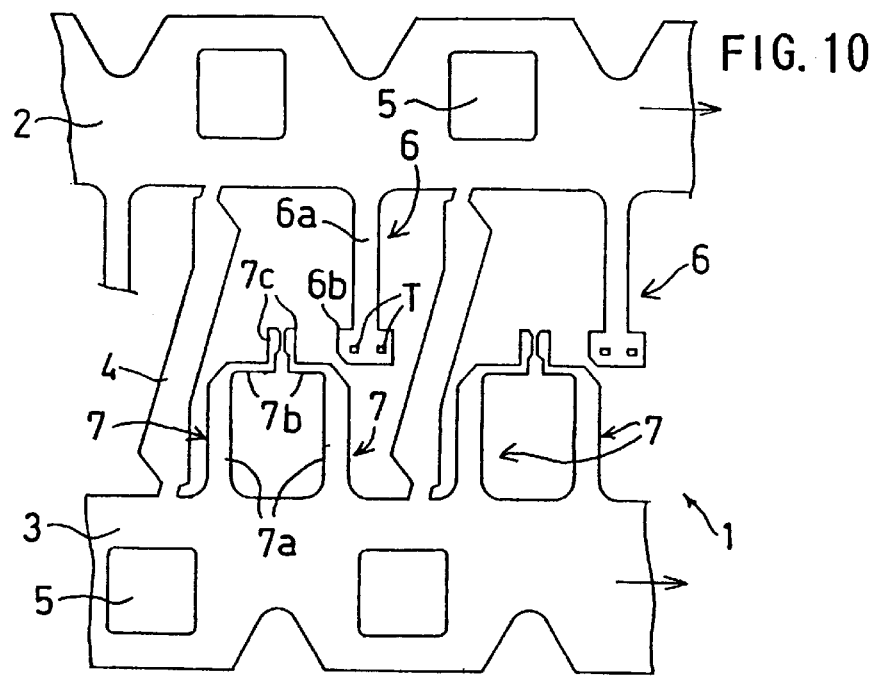
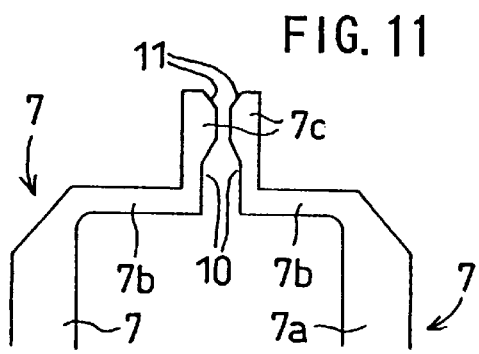
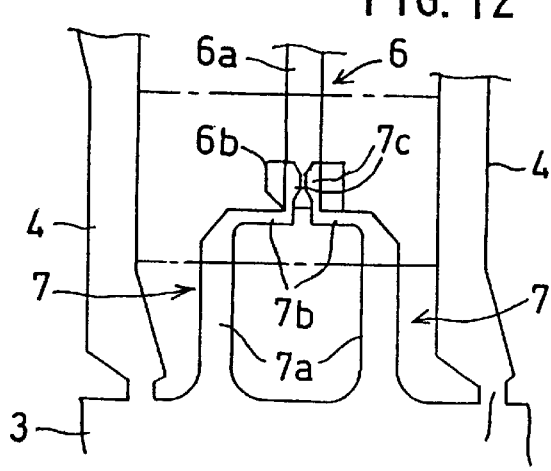
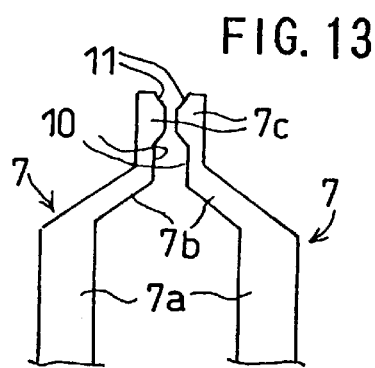
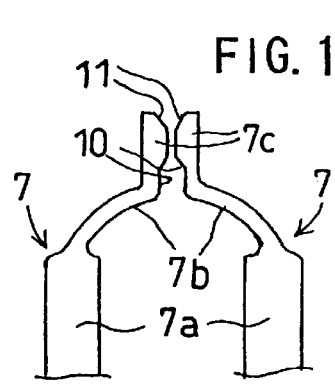
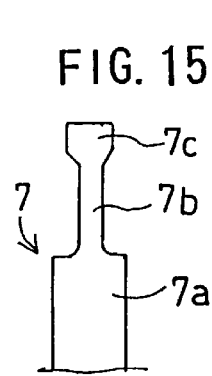

LEAD FRAME AND SEMICONDUCTOR DEVICE MADE BY USING IT

TECHNICAL FIELD

The present invention relates to a lead frame used for making semiconductor devices such as a diode and a transistor for example. The present invention also relates to a semiconductor device using the lead frame.

BACKGROUND ART

A conventional type of semiconductor device may have the following arrangement. Specifically, the semiconductor device includes partially overlapped lead terminals extending in the opposite directions, a semiconductor element (chip) interposed between the partially overlapped lead terminals, and a mold member made of synthetic resin for packaging the semiconductor element together with the members around the semiconductor element. The applicant of the present invention disclosed a lead frame used for making the semiconductor device of the above type in Japanese Patent Publication Nos. 6-36422 and 6-71015. The conventional lead frame is shown in FIGS. 27–29 of the accompanying drawings of this application.

The conventional lead frame 20 includes at least two elongated side frames 21, 22 extending in parallel to each other, and section bars 23 connecting the side frames 21, 22 at predetermined intervals. Each section bar 23 has two joint portions 23a having a relatively small width. Thus, the side frames 21, 22 can be shifted longitudinally with respect to each other. The side frame 21 is formed with a plurality of first lead terminals 24, while the side frame 22 is formed with a corresponding number of second lead terminals 25. The free end portions of the paired first and second lead terminals 24, 25 are arranged close to each other. The side frames 21, 22 are provided with engaging holes 26 at predetermined intervals. These holes are brought into engagement with sprockets (not shown) used to move the side frames 21, 22 longitudinally thereof.

The semiconductor device D is made through the following steps:

① A semiconductor element T is bonded to the free end portion 24a of the first lead terminal 24;

② By moving the side frames 21, 22 at different rates, the free end portion 25a of the second lead terminal 25 is put on the semiconductor element T which is bonded to the first lead terminal 24;

③ The free end portion 25a of the second lead terminal 25 is bonded to the semiconductor element T by soldering, conductive adhesive, or pressure welding for example;

④ With their free end portions 24a, 25a overlapped, the lead terminals 24, 25 are moved to a synthetic resin molding section, at which the semiconductor element T together with other members around the semiconductor element is enclosed by a mold member M of synthetic resin, as indicated by single-dot chain lines in FIG. 29; and ⑤ The lead terminals 24, 25 are cut off at their joint portions after continuity across the terminals is inspected.

According to the prior art, a plurality of semiconductor devices D can be made using a single lead frame 20. Thus, the manufacturing efficiency of the semiconductor devices D is remarkably improved.

In accordance with the above prior art, the section bars 23 are deformed when the side frames 21, 22 are shifted longitudinally. However, the joint portions 23a of each section bar 23 do not entirely undergo plastic deformation but are subjected to elastic deformation to some extent. Thus, due to restoring force from the spring-back action of each section bar 23, the side frames 21, 22 are urged toward the initial positions the frames were held in before the shifting operation. Consequently, the lead terminals 24, 25 are slightly bent. As a result, the elastic force of these terminals 24, 25 may work to cause the lead terminals to be detached from the semiconductor element T, which leads to defective products with improper electrical continuity.

One way to deal with the above problems may be to move the side frames 21, 22 without providing any play between the sprocket and the engaging holes 26. In this way, the spring-back action of the section bars 23 may be completely restrained. In practice however, it is difficult to eliminate the play between the sprocket and the engaging holes 26. Thus, conventionally the defective connection due to the spring-back of the section bars 23 was not completely prevented.

The above problems become more serious in an instance where more than one second lead terminals (corresponding to a single first lead terminal) are bonded to a semiconductor element. Specifically, when use is made of a lead frame provided with a single first lead terminal and more than one second lead terminals to be bonded to a single semiconductor element, the rigidity of the lead terminals put together is increased. Thus, the strength of the detaching force to act on the bonding region between the lead terminals and the semiconductor element is increased. As a result, more lead terminals may be unduly detached from semiconductor elements, thereby increasing the number of defective products.

DISCLOSURE OF THE INVENTION

It is, therefore, an object of the present invention to overcome the problems described above.

According to a first aspect of the present invention, there is provided a lead frame including at least one pair of elongated side frames extending in parallel to each other, and section bars connecting the side frames at predetermined intervals.

One of the side frames is formed with a plurality of first lead terminals which are arranged at predetermined intervals and extend toward another side frame. Each first lead terminal has a free end portion and a base portion. Said another side frame is formed with second lead terminals corresponding to the first lead terminals. Each second lead terminal has a free end portion and a base portion. The first and the second lead terminals are arranged so that the free end portions of the first and the second lead terminals are overlapped when the side frames are shifted longitudinally.

Further, at least one of the first and the second lead terminals includes a predetermined area formed with a weaker portion having a relatively small bending strength.

The weaker portion may be provided in various ways. For instance, the entire free end portion of a lead terminal may have a relatively small width. The free end portion or base portion of a lead terminal may have a constricted portion. Or a hole may be formed at the free end portion or base portion of a lead terminal. It is also possible to cause the free end portion or base portion of a lead terminal to have a smaller thickness in a limited area. A cutout may be formed at the free end portion or base portion of a lead terminal.

Further, for purposes of providing a weaker portion, some of the above arrangements (namely, a narrowed portion, a constricted portion, a hole and the like) may be utilized in combination. Still further, the first and the second lead terminals may be provided with weaker portions of different arrangements, or more than one weaker portions may be formed in a single lead terminal.

Preferably, each of the first lead terminal and the second lead terminal is provided with a weaker portion.

Preferably, a weaker portion formed in a lead terminal is arranged either at a free end region which will be enclosed by a package of synthetic resin or at an area which will remain to be connected to the side frame after the cutting operation. This is because if a product semiconductor device includes a weaker portion at the exposed part of a lead terminal projecting from the package, the bonding operation of the semiconductor device onto a circuit board may not be properly performed. However, if a semiconductor device functions properly, it is possible to form a weaker portion at the exposed part of a lead terminal projecting from the package.

A single first lead terminal may be arranged to correspond to a single second lead terminal. Alternatively, a single first lead terminal may be arranged to correspond to more than one second lead terminals, so that at least three lead terminals are grouped as one unit. Further, the number of the side frames is not limited to two. More than two side frames each formed with lead terminals may be utilized, as shown in FIG. 10 of the above-mentioned Japanese Patent Publication No. 6-36413 for example.

As already described, the first and the second lead terminals are bonded to the semiconductor element after the side frames are shifted relative to each other. At this time, the lead terminals are subjected to bending force due to the spring-back action of the section bars. However, when the lead frame is arranged according to the present invention, most of the bending force is used to deform the weaker portion of the lead terminals. Therefore, it is possible to prevent large detaching force from acting on the bonding region between the lead terminals and the semiconductor element. Thus, it is possible to remarkably reduce the number of defective products, which would otherwise be produced due to the detachment of the lead terminals from the semiconductor element or improper continuity.

According to a second aspect of the present invention, there is provided a semiconductor device using the lead frame described above. It is advantageous that such a semiconductor device reliably maintains a proper bonding state between the lead terminals and the semiconductor element, and has improved quality.

Other features and advantages of the present invention will become clearer from the embodiments described below with reference to the accompanying drawings.

BRIEF DESCRIPTION OF DRAWINGS

FIG. 4 is a plan view showing a second embodiment;

FIG. 5 is a plan view showing a third embodiment;

FIG. 6 is a plan view showing a fourth embodiment;

FIG. 7 is a plan view showing a fifth embodiment;

FIG. 8 is a plan view showing a sixth embodiment;

FIG. 9 is a plan view showing a seventh embodiment;

FIG. 10 is a plan view showing an eighth embodiment;

FIG. 11 is an enlarged view showing a principal part of FIG. 10;

FIG. 12 is a plan view of the eighth embodiment, illustrating a state after a shifting operation;

FIG. 13 is a plan view showing a ninth embodiment;

FIG. 14 is a plan view showing a tenth embodiment;

FIG. 15 is a plan view showing an eleventh embodiment;

BEST MODE FOR CARRYING OUT THE INVENTION

Preferred embodiments of the present invention will be described below with reference to the accompanying drawings.

Figure 1:
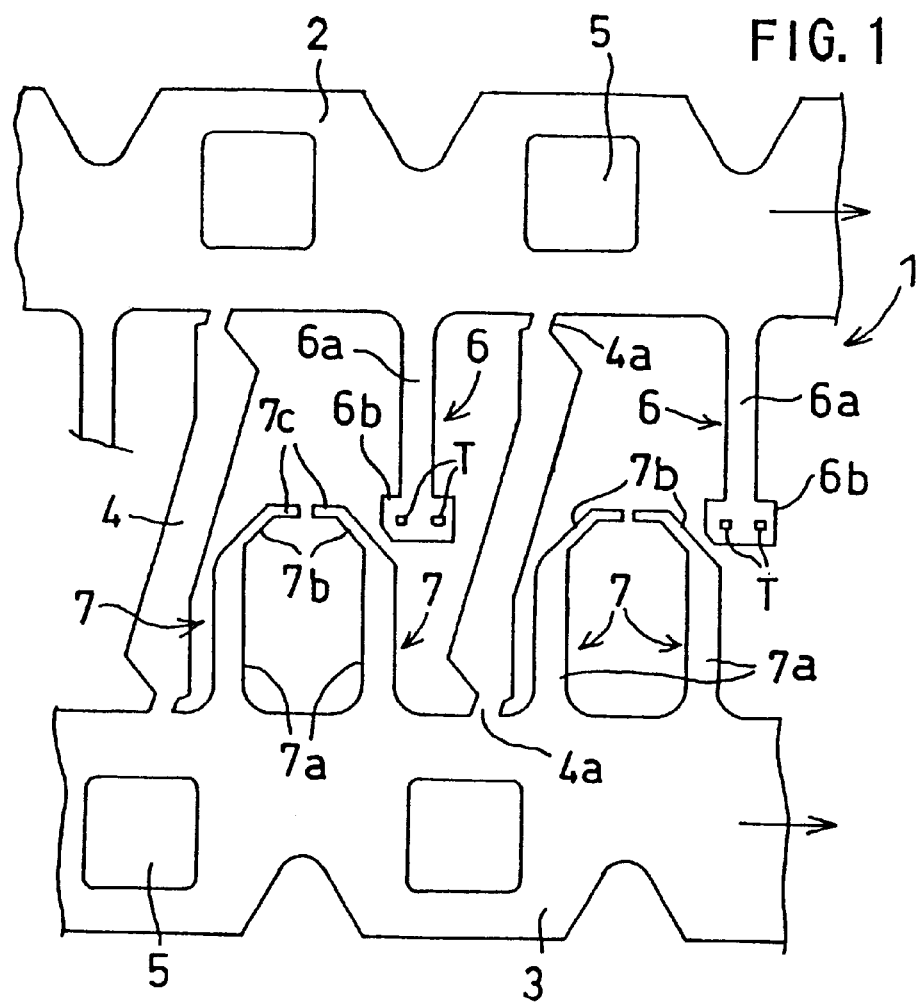
FIG. 1 is a plan view showing a first embodiment.
Figure 2:
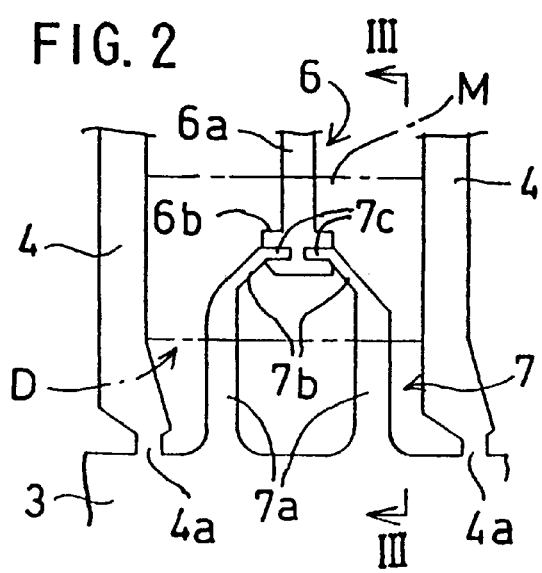
FIG. 2 is a plan view of a principal part of the first embodiment, illustrating a state after a shifting operation.
Figure 3:
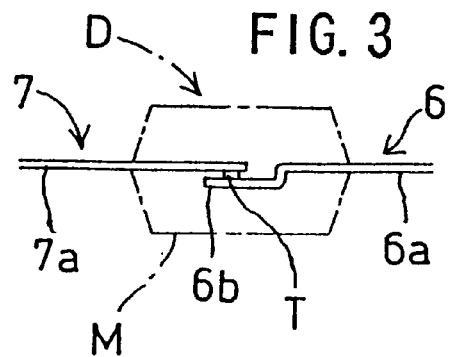
FIG. 3 is a sectional view taken along lines III—III in FIG. 2.

(1) First Embodiment (FIGS. 1–3)

FIGS. 1–3 show the first embodiment. The lead frame 1 may be obtained by stamping out a conductive metal plate such as a copper plate for example. As shown in FIG. 1, the lead frame 1 includes an elongated first side frame 2 and an elongated second side frame 3 which extend in parallel to each other. The lead frame 1 also includes a plurality of section bars 4 connecting the two side frames 2, 3 at predetermined intervals. Each of the side frames 2, 3 is formed with a plurality of generally square engaging holes 5 at predetermined intervals. These holes are brought into engagement with a feeding sprocket (not shown).

Each section bar 4 is formed with a pair of joint portions 4a having a relatively small width. Thus, it is possible to longitudinally shift the side frames 2, 3 with respect to each other. Each section bar 4 is inclined at a predetermined angle with respect to a line extending perpendicular to the side frames 2 and 3. When the side frames 2, 3 are shifted, each section bar 4 takes a position in which it extends perpendicular to the side frames 2 and 3, as shown in FIG. 2.

The first side frame 2 is integrally formed with first lead terminals 6 each arranged between adjacent section bars 4. The first lead terminal 6, which extends toward the second side frame 3, includes a base portion 6a and an enlarged extremity 6b extending from the base portion. Semiconductor elements T are bonded to the enlarged extremity 6b. The first lead terminal 6 is offset toward one of the adjacent section bars 4.

Between adjacent section bars 4, the second side frame 3 is integrally formed with two second lead terminals 7 extending toward the first side frame 2. The two second lead terminals 7 include base portions 7a extending in parallel to each other, and inclined free end portions 7b approaching each other. The free end portions include extremities 7c which extend in a common line toward each other but are spaced by a predetermined distance. The free end portion 7b (including the extremity 7c) is made smaller in width than the base portion 7a. In this way, the free end portion 7b is formed as a mechanically weaker portion whose bending strength is smaller than that of the base portion 7a.

It is arranged that the extremity 7c of the second lead terminal 7 overlaps the enlarged extremity 6b of the first lead terminal 6, as viewed widthwise of the side frames 2, 3. The first lead terminal 6 is arranged outside the two second lead terminals 7 as viewed longitudinally of the side frames 2, 3. The enlarged extremity 6b of the first lead terminal 6 is wide enough to bridge between the extremities 7c of the respective second lead terminals 7.

By utilizing the lead frame 1 having the above arrangement, a semiconductor device D may be made through the following procedure. Specifically, the procedure may include: a step of bonding a semiconductor T to the enlarged extremity 6b of the first lead terminal 6 while the lead frame 1 is being moved longitudinally thereof; a step of shifting the lead terminals 6, 7 for causing them to overlap each other; a step of packaging; a step of inspecting; and a step of cutting the lead terminals 6 and 7 off the first and the second side frames 2 and 3. In the illustrated embodiment, two semiconductor elements T are used for the two second lead terminals 7. However, only a single semiconductor element T may be bonded to the two second lead terminals 7.

Typically, prior to the bonding step of the semiconductor elements T, the first lead terminal 6 may be deformed so that its free end region has a downward step portion, as shown in FIG. 3. Alternatively, it is possible to deform the second lead terminal 7 so that its free end portion 7b has an upward step portion. Further, both of the first and the second lead terminals 6, 7 may be deformed so that their free end regions have vertically opposite step portions. With such arrangements, the base portion 6a of the first lead terminal 6 and the base portions 7a of the second lead terminals 7 can be arranged at the same height after these terminals are connected to the semiconductor elements T. However, the above deforming step for the lead terminals 6 and 7 may be omitted if the presence of a height difference between the lead terminals 6, 7 causes no trouble.

In general, after the lead terminals 6 and 7 are fixed to the semiconductor elements T, those lead terminals may be subjected to bending force due to the spring-back action of the section bars 4. However, according to the present invention, the bending force acting on the lead terminals is used to deform the free end portions 7b of the second lead terminals 7. Thus, it is possible to avoid large detaching force acting on the bonding region between the lead terminals 6, 7 and the semiconductor elements T. As a result, the bonding state of the lead terminals 6, 7 to the semiconductors T is advantageously maintained, thereby remarkably reducing the number of defective devices.

(2) Second Embodiment (FIG. 4)

According to the second embodiment shown in FIG. 4, the second lead terminals 7 are similar to those of the first embodiment, whereas each first lead terminal 6 includes a constricted portion 8 (or a partially narrowed portion) at a connecting region (referred to as "neck" hereinafter) bridging between the base portion 6a and the enlarged extremity 6b. The constricted portion 8 is a mechanically weaker portion. According to this embodiment, the first lead terminal 6 is also easily deformed at the constricted portion 8. Thus, it is possible to more reliably prevent the lead terminals 6, 7 from coming off the semiconductor elements T. As a result, the number of defective devices is much more reduced.

As shown in FIG. 4, the constricted portion 8 is formed by cutting away square portions from both side edges of the first lead terminal 6. However, a constricted portion 8 may be formed by cutting away a portion from only one of the edges of the first lead terminal 6. Further, it is also possible to cut away a semicircular part, triangular part, or trapezoidal part from an edge of the first lead terminal 6. In this way, the constricted portion 8 is provided in various manners. Further, the lead terminal 6 may be formed with a plurality of constricted portions 8.

(3) Third Embodiment (FIG. 5)

According to the third embodiment shown in FIG. 5, each second lead terminal 7 includes a narrowed free end portion 7b, while the first lead terminal 6 is formed with a square hole 9 at a connecting portion bridging between the base portion 6a and the enlarged extremity 6b. Thus, the connecting portion at the hole 9 functions as a weaker portion. The shape of the hole 9 is not limited to a square, but may be a circle, ellipse, triangle or the like. Further, the lead terminal 6 may be formed with a plurality of holes 9.

This embodiment can enjoy the same advantage as is obtained by the second embodiment.

(4) Fourth–Seventh Embodiments (FIGS. 6–9)

FIGS. 6–9 show modified versions of the free end portion 7b of the second lead terminal 7. According to the fourth embodiment shown in FIG. 6, the narrowed free end portion 7b is formed as a simple inclined portion. According to the fifth embodiment shown in FIG. 7, the narrowed free end portion 7b is formed as an arcuate portion, whereas according to the sixth embodiment shown in FIG. 8, the narrowed free end portion 7b is bent like stairs.

According to the seventh embodiment shown in FIG. 9, only a single first lead terminal 6 and a single second lead terminal 7 are used as one unit. The free end portion 7b of the second lead terminal 7 is arranged to extend horizontally. The free end portion 7b has a relatively small width so that it serves as a weaker portion.

It is also possible to provide the free end region of the first lead terminal 6 with a relatively narrow portion.

(5) Eighth Embodiment (FIGS. 10–12)

FIGS. 10–12 show the eighth embodiment.

For this embodiment, use is made of two second lead terminals 7 between adjacent section bars 4. Each second lead terminal 7 has a generally L-shaped free end portion 7b. The free end portion 7b except for its extremity 7c is reduced in width to serve as a weaker portion. The extremities 7c of the respective second lead terminals 7 have facing sides formed into a trapezoid. This trapezoidal shape is provided by cutting away upper and lower parts from the facing side of the free end portion 7b of each second lead terminal 7 (the cut-out portions are indicated by reference numerals 10 and 11).

For making a small semiconductor device D, it is desirable to minimize the distance between the free end portions 7b of the respective second lead terminals 7. In order to absorb the restoring force of the section bars 4, it is preferable to maximize the length of the free end portion 7b of each second lead terminal 7.

However, in an instance where the free end portions 7b of the respective second lead terminals 7 are made into a simple L-shape (i.e., without a trapezoidal portion as described above), if the distance between the two free end portions 7b is too small, the following problem will occur. Specifically, it is supposed that the lead frame 1 is made by punching out a material plate using a punch (press die). This punch is provided with an elongated portion for punching out the part between the free end portions 7b of the two second lead terminals 7. When the above-mentioned distance between the two free end portions 7b is desired to be small, the elongated portion of the punch should also be small in width. Such an arrangement, however, makes the punch less durable to a great extent. Therefore, when the free end portion 7b is made into the simple L-shape, the distance between the free end portions 7b should not be too small.

On the other hand, when the free end portion 7b is formed with the cutouts 10, 11 according to the illustrated embodiment, the above-mentioned elongated portion of the punch is advantageously reduced in length. As a result, the deterioration of the durability of the punch is avoided. Thus, the distance between the extremities 7c can be minimized, while the length of each free end portion 7b is maximized.

Thus, according to the eighth embodiment, the size of a resulting semiconductor device D having three terminals is minimized, while maintaining good processability of the lead frame 1. In addition, since the free end portion 7b of the second lead terminal 7 can be deformed to a great extent, defective connection to the semiconductor element T is reliably reduced.

(6) Ninth–Eleventh Embodiments (FIGS. 13–15)

FIGS. 13 and 14 show modified versions of the eighth embodiment. According to the ninth embodiment shown in FIG. 13, the free end portion 7b except for the extremity 7c of the second lead terminal 7 is formed as an inclined portion. According to the tenth embodiment shown in FIG. 14, the free end portion 7b except for the extremity 7c of the second lead terminal 7 is formed as an arcuate portion.

According to the eleventh embodiment shown in FIG. 15, use is made of a single second lead terminal 7 between adjacent section bars 4. The second lead terminal 7 is made in a linear form. The free end portion 7b except for the extremity 7c has a relatively small width.

Figure 16:
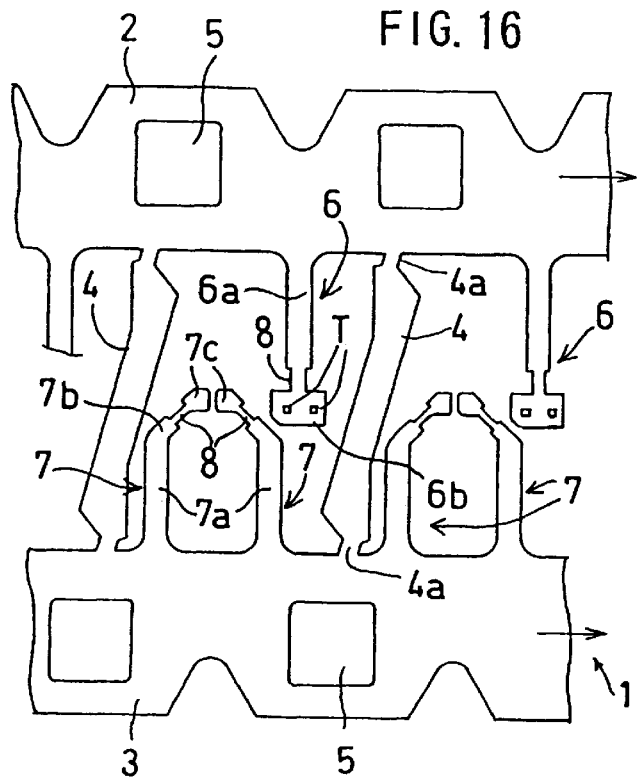
FIG. 16 is a plan view showing a twelfth embodiment.
Figure 17:
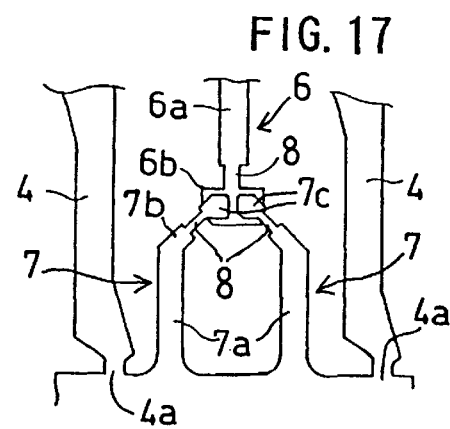
FIG. 17 is a plan view of the twelfth embodiment, illustrating a state after a shifting operation.

(7) Twelfth Embodiment (FIGS. 16–17)

FIGS. 16 and 17 show the twelfth embodiment. According to this embodiment, the first lead terminal 6 has a neck formed with a constricted portion 8. Use is made of two second lead terminals 7 between adjacent section bars 4. The two second lead terminals 7 have free end portions 7b inclined to approach each other. The free end portion 7b is formed with a constricted portion 8.

Figure 18:
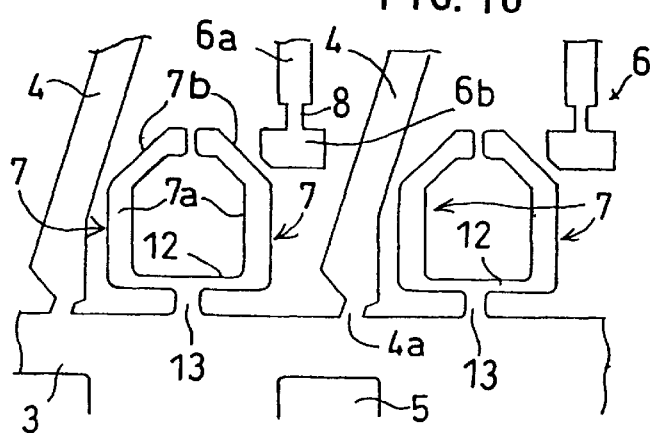
FIG. 18 is a plan view showing a thirteenth embodiment.

(8) Thirteenth Embodiment (FIG. 18)

FIG. 18 shows the thirteenth embodiment. According to this embodiment, use is made of a single first lead terminal and two second lead terminals 7 between adjacent section bars 4. The first lead terminal 6 has a neck formed with a constricted portion 8. The two second lead terminals 7 are connected to each other at their base ends via a connection bar 12. The connection bar 12 is smaller in width than the base portion 7a of the second lead terminal 7. The connection bar 12 is connected to the second side frame 3 via a bridging member 13.

According to this embodiment, the connection bar 12 and the bridging member 13 serve as a weaker portion. With such an arrangement, the bending force acting on the second lead terminal 7 due to the restoring action of the section bars 4 is used to deform the connection bar 12 and the bridging member 13. It should be noted that the connection bar 12 and the bridging member 13 are sufficiently spaced away from the semiconductor elements T. Therefore, the restoring force of the section bars 4 is concentrated, as a moment, on the connection bar 12 and the bridging member 13. As a result, the connection bar 12 and the bridging member 13 are effectively deformed.

It is possible to arrange so that only either one of the connection bar 12 and the bridging member 13 functions as a weaker portion. The bridging member 13 can be considered as a constricted portion.

Figure 19:
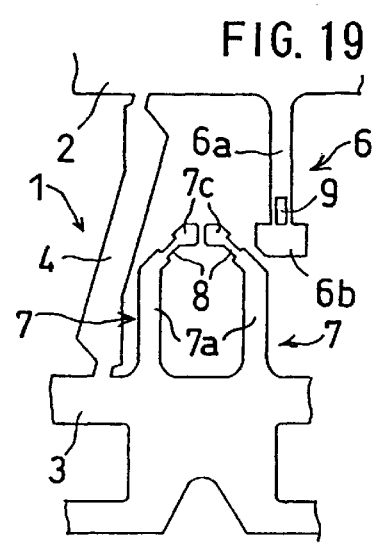
FIG. 19 is a plan view showing a fourteenth embodiment.
Figure 20:
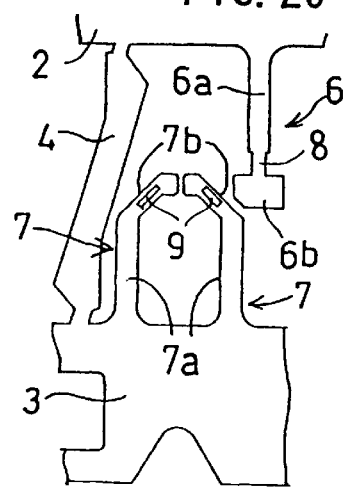
FIG. 20 is a plan view showing a fifteenth embodiment.

(9) Fourteenth–Fifteenth Embodiments (FIGS. 19–20)

According to the fourteenth embodiment shown in FIG. 19, two second lead terminals 7 are provided between adjacent section bars 4. Each lead terminal 7 has a free end portion 7b formed with a constricted portion 8. The first lead terminal 6 has a neck formed with a hole 10. According to the fifteenth embodiment shown in FIG. 20, the first lead terminal 6 has a neck formed with a constricted portion 9. Each second lead terminal 7 has an inclined free end portion 7b formed with a hole 9.

Figure 21:
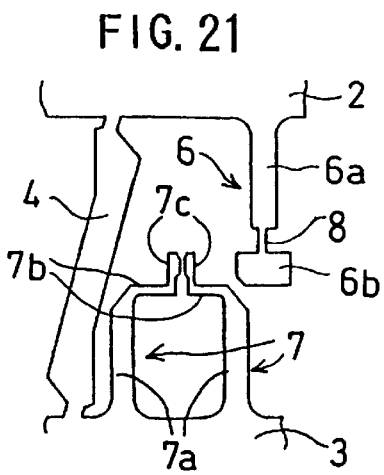
FIG. 21 is a plan view showing a sixteenth embodiment.

(10) Sixteenth Embodiment (FIG. 21)

According to the sixteenth embodiment shown in FIG. 21, the first lead terminal 6 has a neck formed with a constricted portion 8. Each second lead terminal 7 includes an L-shaped free end portion 7b having a relatively small width.

Figure 22:
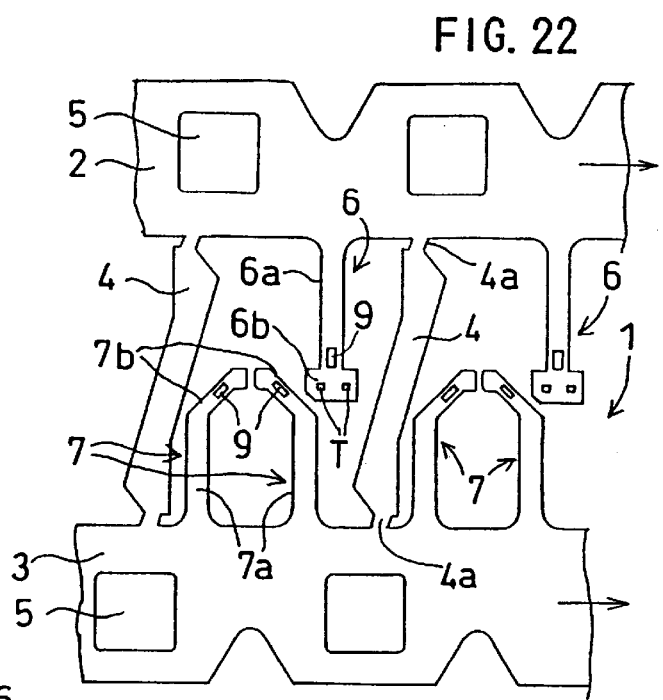
FIG. 22 is a plan view showing a seventeenth embodiment.
Figure 23:
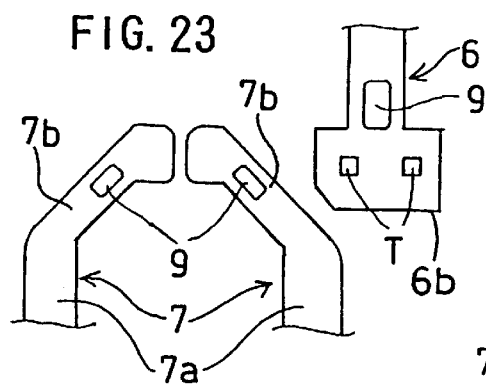
FIG. 23 is an enlarged view showing a principal part of FIG. 22.
Figure 24:
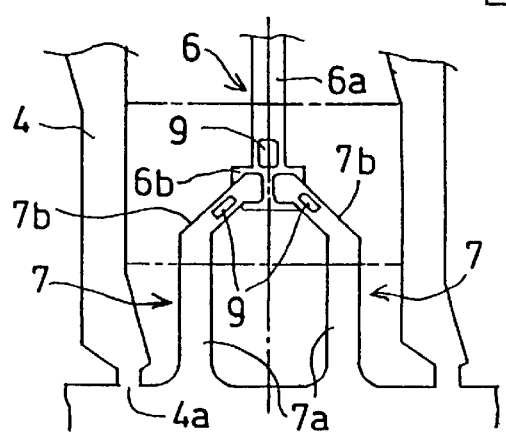
FIG. 24 is a plan view of the seventeenth embodiment, illustrating a state after a shifting operation.

(11) Seventeenth Embodiment (FIGS. 22–24)

FIGS. 22–24 show the seventeenth embodiment. According to this embodiment, the first lead terminal 6 has a neck formed with a hole 9 to provide a weaker portion, while each second lead terminal 7 has an inclined free end portion 7b formed with a hole 9 to provide a weaker portion.

Figure 25:
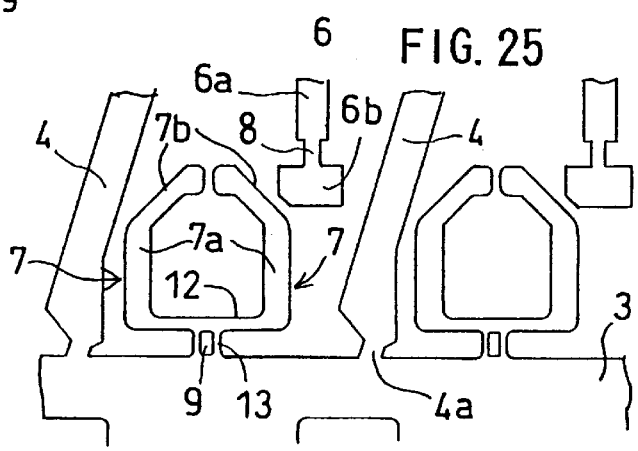
FIG. 25 is a plan view showing an eighteenth embodiment.

(12) Eighteenth Embodiment (FIG. 25)

According to the eighteenth embodiment shown in FIG. 25, the first lead terminal 6 has a neck formed with a constricted portion 8. Two second lead terminals 7 are connected to each other via a connection bar 12. The connection bar 12 is connected to the second side frame 3 via a bridging member 13. The bridging member 3 is formed with a hole 9. This embodiment is a modified version of the thirteenth embodiment shown in FIG. 18.

Instead of (or in addition to) the hole 9 at the bridging member 13 of the second lead terminal 7, the inclined free end portion 7b of each second lead terminal 7 may be formed with a hole or constricted portion.

Figure 26:
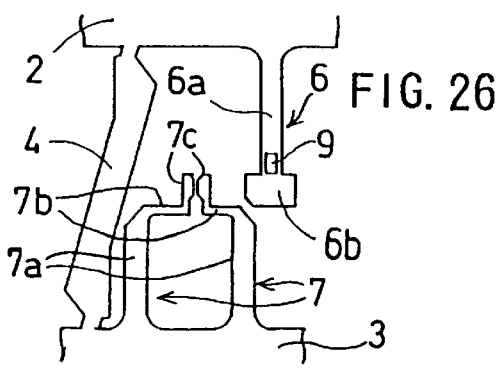
FIG. 26 is a plan view showing a nineteenth embodiment.
Figure 27:
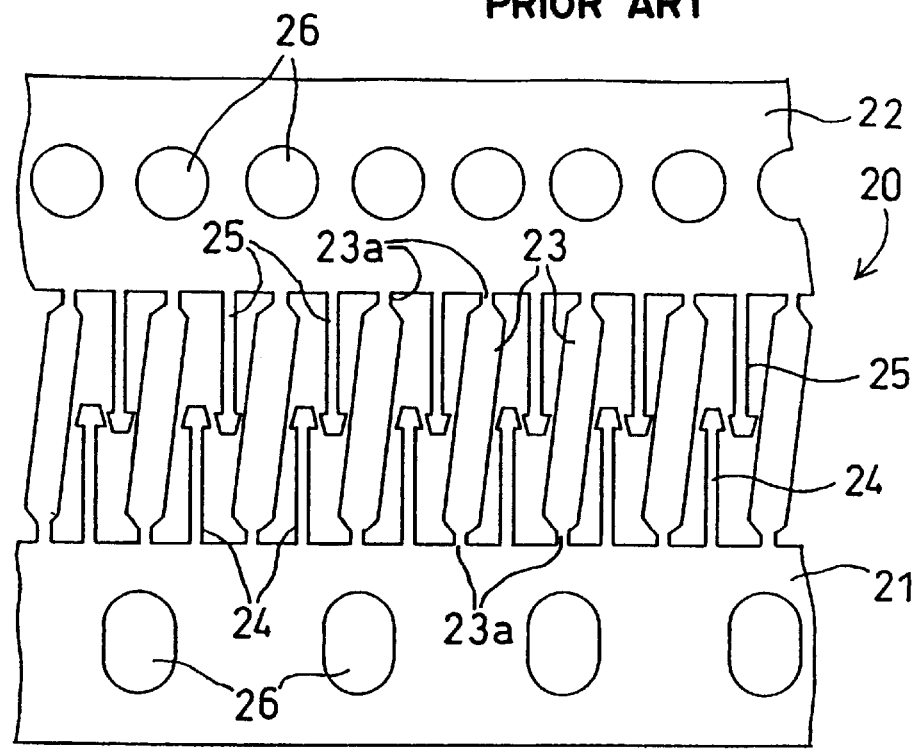
FIG. 27 is a plan view showing a prior art lead frame.
Figure 28:
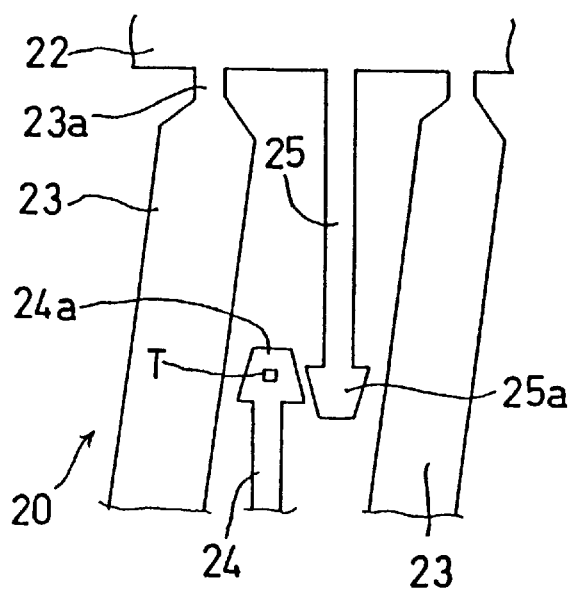
FIG. 28 is an enlarged view showing a principal part of FIG. 27.
Figure 29:
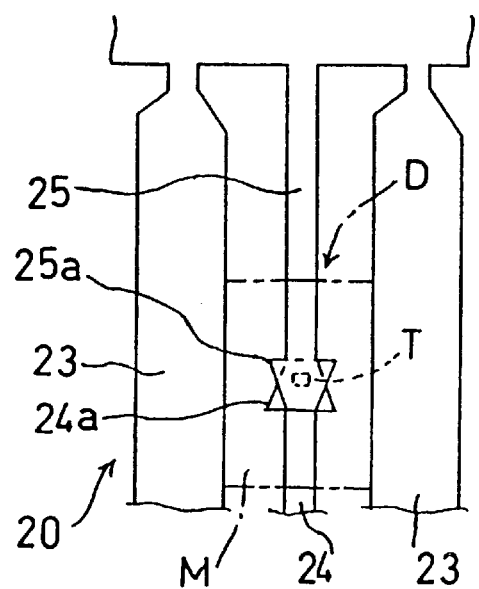
FIG. 29 is a plan view of a principal part of the prior art lead frame, illustrating a state after a shifting operation.

(13) Nineteenth Embodiment (FIG. 26)

According to the nineteenth embodiment shown in FIG. 26, the first lead terminal 6 has a neck formed with a hole 9, while each second lead terminal 7 includes an L-shaped (as viewed from above) free end portion 7b having a relatively small width. This embodiment is a modified version of the eighth embodiment shown in FIGS. 10–13.

The preferred embodiments of the present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A lead frame comprising:

a first elongated side frame;

a second elongated side frame extending in parallel to the first elongated side frame;

section bars connecting the first side frame and the second side frame at predetermined intervals for allowing the first side frame and the second side frame to be shifted relative to each other longitudinally thereof;

a plurality of first lead terminals arranged at predetermined intervals and extending from the first side frame toward the second side frame, each first lead terminal including a base portion and an enlarged semiconductor-mounting free end portion; and a plurality of second lead terminals arranged in corresponding relationship to the plurality of first lead terminals and extending from the second side frame toward the first side frame, each second lead terminal including a base portion and a free end portion, the free end portion of each said second lead overlapping the free end portion of a corresponding first lead terminal when the first side frame and the second side frame are shifted relative to each other longitudinally thereof;

wherein each said first lead terminal includes a weakening neck portion between the base portion and the free end portion of each said first lead terminal, the weakening neck portion being narrower than the base portion and the free end portion of each said first lead terminal.

2. A lead frame comprising:

a first elongated side frame;

a second elongated side frame extending in parallel to the first elongated side frame;

section bars connecting the first side frame and the second side frame at predetermined intervals for allowing the first side frame and the second side frame to be shifted relative to each other longitudinally thereof;

a plurality of first lead terminals arranged at predetermined intervals and extending from the first side frame toward the second side frame, each first lead terminal including a base portion and an enlarged semiconductor-mounting free end portion; and a plurality of second lead terminals arranged in corresponding relationship to the plurality of first lead terminals and extending from the second side frame toward the first side frame, each second lead terminal including a base portion and a free end portion, the free end portion of each said second lead overlapping the free end portion of a corresponding first lead terminal when the first side frame and the second side frame are shifted relative to each other longitudinally thereof;

wherein each said first lead terminal is formed with a weakening hole between the base portion and the free end portion of each said first lead terminal.

3. A lead frame comprising:

a first elongated side frame;

a second elongated side frame extending in parallel to the first elongated side frame;

section bars connecting the first side frame and the second side frame at predetermined intervals for allowing the first side frame and the second side frame to be shifted relative to each other longitudinally thereof;

a plurality of first lead terminals arranged at predetermined intervals and extending from the first side frame toward the second side frame, each first lead terminal including a base portion and an enlarged semiconductor-mounting free end portion; and a plurality of second lead terminals arranged in corresponding relationship to the plurality of first lead terminals and extending from the second side frame toward the first side frame, each second lead terminal including a base portion and a free end portion, the free end portion of each said second lead overlapping the free end portion of a corresponding first lead terminal when the first side frame and the second side frame are shifted relative to each other longitudinally thereof;

wherein at least part of the free end portion of each said second lead terminal is considerably narrower than the base portion of each said second lead terminal.

4. A lead frame comprising:

a first elongated side frame;

a second elongated side frame extending in parallel to the first elongated side frame;

section bars connecting the first side frame and the second side frame at predetermined intervals for allowing the first side frame and the second side frame to be shifted relative to each other longitudinally thereof;

a plurality of first lead terminals arranged at predetermined intervals and extending from the first side frame toward the second side frame, each first lead terminal including a base portion and an enlarged semiconductor-mounting free end portion; and a plurality of second lead terminals arranged in corresponding relationship to the plurality of first lead terminals and extending from the second side frame toward the first side frame, each second lead terminal including a base portion and a free end extremity, only the free end extremity of each said second lead overlapping the free end portion of a corresponding first lead terminal when the first side frame and the second side frame are shifted relative to each other longitudinally thereof;

wherein each said second lead terminal is formed with a weakening hole at a position other than the free end extremity.

5. A lead frame comprising:

a first elongated side frame;

a second elongated side frame extending in parallel to the first elongated side frame;

section bars connecting the first side frame and the second side frame at predetermined intervals for allowing the first side frame and the second side frame to be shifted relative to each other longitudinally thereof;

a plurality of first lead terminals arranged at predetermined intervals and extending from the first side frame toward the second side frame, each first lead terminal including a base portion and an enlarged semiconductor-mounting free end portion; and a plurality of second lead terminals arranged in corresponding relationship to the plurality of first lead terminals and extending from the second side frame toward the first side frame, each second lead terminal including a base portion and a free end portion, the free end portion of each said second lead overlapping the free end portion of a corresponding first lead terminal when the first side frame and the second side frame are shifted relative to each other longitudinally thereof;

wherein at least two of the second lead terminals are connected to each other at their base portions by means of a connection bar extending in parallel to the second side frame, the connection bar being connected to the second side frame by means of a bridging member, the connection bar and the bridging member functioning as a weakening portion.

* * * * *